(12) United States Patent
Masuda et al.

(10) Patent No.: US 9,539,824 B2
(45) Date of Patent: Jan. 10, 2017

(54) IRRADIATION DEVICE AND IMAGE RECORDING DEVICE

(71) Applicant: SEIKO EPSON CORPORATION, Tokyo (JP)

(72) Inventors: Norihiro Masuda, Nagano (JP); Kazuhito Hori, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 79 days.

(21) Appl. No.: 14/616,168

(22) Filed: Feb. 6, 2015

(65) Prior Publication Data

US 2015/0239262 A1    Aug. 27, 2015

(30) Foreign Application Priority Data

Feb. 26, 2014    (JP) .................................. 2014-035047

(51) Int. Cl.
    *B41J 11/00*         (2006.01)
    *H01L 27/15*         (2006.01)
    *H05B 33/08*         (2006.01)

(52) U.S. Cl.
    CPC ........... *B41J 11/002* (2013.01); *B41J 11/0015* (2013.01); *H01L 27/156* (2013.01); *H05B 33/08* (2013.01); *H05B 33/0803* (2013.01); *H05B 33/0806* (2013.01)

(58) Field of Classification Search
    CPC ...... H05B 33/0806; B41J 11/002; B41F 23/08
    See application file for complete search history.

(56) References Cited

U.S. PATENT DOCUMENTS

| | | | |
|---|---|---|---|
| 2009/0174840 A1* | 7/2009 | Lee | H05K 1/142 349/67 |
| 2010/0052564 A1* | 3/2010 | Park | G09G 3/3426 315/291 |
| 2010/0134406 A1* | 6/2010 | Maruyama | G09G 3/3426 345/102 |
| 2014/0210880 A1* | 7/2014 | Edlitz et al. | 347/5 |

FOREIGN PATENT DOCUMENTS

JP        2012-020482 A      2/2012
WO   WO 2012016891 A1 *  2/2012

\* cited by examiner

*Primary Examiner* — Kendrick Liu
(74) *Attorney, Agent, or Firm* — Global IP Counselors, LLP

(57) ABSTRACT

An irradiation device includes a first LED row having a plurality of LEDs aligned in one row and electrically connected in series, and a second LED row having a plurality of LEDs aligned in one row and electrically connected in series. The first LED row and the second LED row are aligned adjacent to each other in a direction that crosses an array direction of the LEDs of the first LED row. A direction of current flowing in the first LED row is opposite to a direction of current flowing in the second LED row.

8 Claims, 7 Drawing Sheets

IRRADIATION DEVICE AND IMAGE RECORDING DEVICE

CROSS-REFERENCE TO RELATED APPLICATIONS

This application claims priority to Japanese Patent Application No. 2014-035047 filed on Feb. 26, 2014. The entire disclosure of Japanese Patent Application No. 2014-035047 is hereby incorporated herein by reference.

BACKGROUND

Technical Field

The present invention relates to an irradiation device equipped with a plurality of LEDs (Light Emitting Diodes) and an image recording device equipped with that irradiation device.

Related Art

With FIG. 4 of Japanese Unexamined Patent Publication No. 2012-20482, noted is an ultraviolet irradiation device for which provided in a plurality of rows are groups formed from a plurality of LEDs aligned in a row in the diagonal direction. With each group, a plurality of LEDs are electrically connected in series, and ultraviolet rays are emitted from each LED by power being provided from one side (the A side) to the other side (the B side). In other words, with this ultraviolet irradiation device, the power provision directions of all the groups are aligned.

SUMMARY

However, with the LED rows for which a plurality of LEDs are electrically connected in series aligned in a row, there were cases when the peak of the illumination distribution was biased in the current direction. In contrast to this, with the irradiation device of Japanese Unexamined Patent Publication No. 2012-20482, the current direction is aligned for all the LED rows (groups). Because of that, the illumination distribution of each LED row biased to the same side adds up together, and there was the risk of large bias occurring for the overall illumination distribution of the irradiation device. However, there is no special consideration made in the above mentioned publication for this kind of illumination distribution bias.

This invention was created considering the problems noted above, and with an irradiation device equipped with a plurality of LEDs and an image recording device equipped with that irradiation device, an object is to provide technology that makes it possible to inhibit bias of the illumination distribution of the irradiation device.

To achieve the object noted above, an irradiation device according to one aspect includes a first LED row and a second LED row. The first LED row has a plurality of LEDs aligned in one row and electrically connected in series. The second LED row has a plurality of LEDs aligned in one row and electrically connected in series. The first LED row and the second LED row are aligned adjacent to each other in a direction that crosses an array direction of the LEDs of the first LED row. A direction of current flowing in the first LED row is opposite to a direction of current flowing in the second LED row.

To achieve the object noted above, an image recording device according to another aspect includes a conveyance unit, a discharge unit and an irradiation device. The conveyance unit is configured and arranged to convey recording media. The discharge unit is configured and arranged to discharge photocurable liquid on the recording media conveyed by the conveyance unit. The irradiation device is configured and arranged to cure the liquid discharged on the recording media by irradiating light on the recording media conveyed by the conveyance unit. The irradiation device includes a first LED row and a second LED row. The first LED row has a plurality of LEDs aligned in one row and electrically connected in series. The second LED row has a plurality of LEDs aligned in one row and electrically connected in series. The first LED row and the second LED row are aligned adjacent to each other in a direction that crosses an array direction of the LEDs of the first LED row. A direction of current flowing in the first LED row is opposite to a direction of current flowing in the second LED row.

The irradiation device and the image recording device constituted in this way is equipped with the first LED row has a plurality of LEDs aligned in one row and electrically connected in series, the second LED row has a plurality of LEDs aligned in one row and electrically connected in series, with the first LED row and the second LED row being aligned adjacent to each other in a direction that crosses an array direction of the LEDs of the first LED row. Also, a direction of current flowing in the first LED row is opposite to a direction of current flowing in the second LED row. Therefore, the direction for which the peak of the illumination distribution of the first LED row is biased and the direction for which the peak of the illumination distribution of the second LED row is based are opposite, so the peak bias is relatively inhibited for the first and second LED rows overall. As a result, it is possible to inhibit bias of the illumination distribution of the irradiation device.

The irradiation device is preferably constituted such that one of the LEDs provided at one end in the array direction among the LEDs contained in the first LED row and one of the LEDs provided at the one end in the array direction among the LEDs contained in the second LED rows are electrically connected so that the first LED row and the second LED row are electrically connected in series. With that constitution, the first LED row and the second LED row are connected in series at one end of the array direction, so it is possible to supply current to the first LED row and the second LED row at the other end of the array direction. Specifically, because it is possible to supply current from the same side to each LED row, it is possible to easily lead the wiring for supplying current.

The irradiation device is preferably constituted to be equipped with a third LED row having a plurality of LEDs aligned in one row and electrically connected in series, and a fourth LED row having a plurality of LEDs aligned in one row and electrically connected in series. The third LED row and the fourth LED row are preferably aligned adjacent to each other in the direction that crosses the array direction. A direction of current flowing in the third LED row is preferably opposite to a direction of current flowing in the fourth LED row. The third LED row is preferably arranged on a side of the one end in the first LED row in the array direction, and the fourth LED row is preferably arranged on the side of the one end in the second LED row in the array direction. One of the LEDs provided at the other end in the array direction among the LEDs contained in the third LED row and one of the LEDs provided at the other end in the array direction among the LEDs contained in the fourth LED row are preferably electrically connected so that the third LED row and the fourth LED row are electrically connected in series.

This constitution is equipped with a third LED row having a plurality of LEDs aligned in one row and electrically connected in series, and a fourth LED row having a plurality of LEDs aligned in one row and electrically connected in series, in which the third LED row and the fourth LED row are aligned adjacent to each other in the direction that crosses the array direction. Also, the direction of the current flowing in the third LED row is opposite to the direction of the current flowing in the fourth LED row. As a result, the same as the case of the first and second LED rows described above, it is possible to inhibit variation of the illumination distribution of the irradiation device. Furthermore, the third LED row and the fourth LED row are connected at the other end of the array direction, so it is possible to supply current to the third LED row and the fourth LED row at one end of the array direction. Specifically, because it is possible to supply current from the same side to each LED row, it is possible to easily lead the wiring for supplying the current.

However, the third LED row is arranged at one side of the array direction with respect to the first LED row, and the fourth LED row is arranged at one side of the array direction with respect to the second LED row. Specifically, the third and fourth LED rows are adjacent at one side of the array direction with respect to the first and second LED rows. In this case, it is suitable to lead without mutual interference the wiring for supplying current to the first and second LED rows and the wiring for supplying current to the third and fourth LED rows. In contrast to this, it is possible to supply current at the other end of the array direction to the first and second LED rows, and possible to supply current to the one end of the array direction to the third and fourth LED rows. As a result, it is possible to lead the wiring for the first and second LED rows and to lead the wiring for the third and fourth LED rows on the opposite side to each other without interference.

The irradiation device preferably has a constitution in which the direction of the current flowing in the first LED row and the direction of the current flowing in the third LED row are opposite, and the direction of the current flowing in the second LED row and the direction of the current flowing in the fourth LED row are opposite. Alternatively, the irradiation device preferably has a constitution in which the direction of the current flowing in the first LED row and the direction of the current flowing in the third LED row are the same, and the direction of the current flowing in the second LED row and the direction of the current flowing in the fourth LED row are the same.

The irradiation device preferably has a constitution in which the first LED row and the second LED row are not electrically connected in series.

Also, there can be various modes for the number of LEDs constituting the LED rows. In light of that, the irradiation device preferably has a constitution in which the first LED row has five or more and ten or less LEDs, and the second LED row has five or more and ten or less LEDs. Alternatively, the irradiation device can have a constitution in which the first LED row and the second LED row have the same number of LEDs.

However, with the image recording device noted above, the irradiation device cures the liquid discharged on the recording media by irradiating light on the recording media conveyed by the conveyance unit. With this image recording device, when there is a large volume of bias of the illumination distribution in the direction in which the liquid moves along with the recording media, there is also the risk of not being able to appropriately perform curing of the liquid. In light of that, the image recording device can have a constitution in which with the first LED row, the plurality of LEDs are aligned in the direction in which the conveyance unit conveys the recording media, and with the second LED row, the plurality of LEDs are aligned in the direction in which the conveyance unit conveys the recording media. With this kind of constitution, it is possible to inhibit bias of the illumination distribution in the direction in which the liquid moves along with the recording media, and to suitably perform curing of the liquid.

BRIEF DESCRIPTION OF THE DRAWINGS

Referring now to the attached drawings which form a part of this original disclosure.

DETAILED DESCRIPTION OF EXEMPLARY EMBODIMENTS

Figure 1:
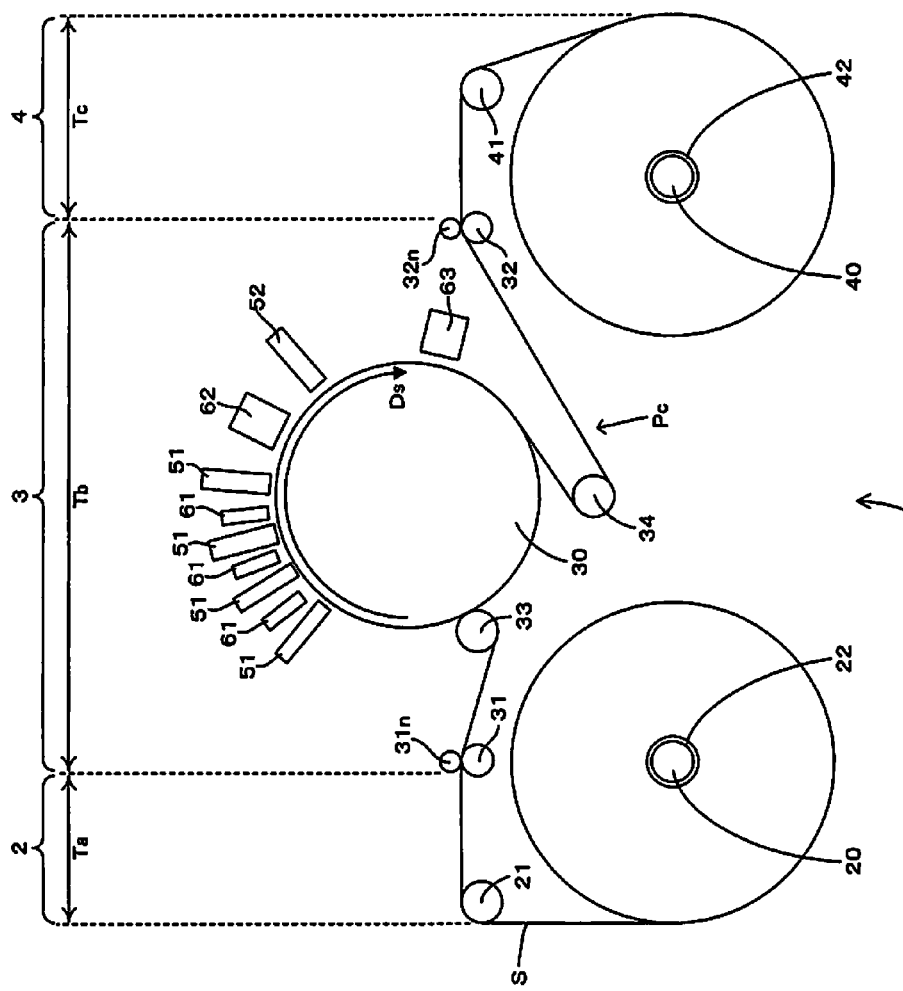
FIG. 1 is a front view schematically showing an example of the configuration of a printer to which the present invention is applied.

FIG. 1 is a front view schematically showing an example of the constitution of a printer to which the present invention is applied. As shown in FIG. 1, with a printer 1, one sheet S (web) for which both ends are wound into roll form on a delivery shaft 20 and a winding shaft 40 is stretched along a conveyance path Pc, and the sheet S undergoes image recording while being conveyed in a conveyance direction Ds facing from the delivery shaft 20 to the winding shaft 40. The type of sheet S is roughly divided into film paper type and film type. To give specific examples, for paper types, there is high quality paper, cast paper, art paper, coated paper and the like, and for the film type, there is synthetic paper, PET (Polyethylene terephthalate) film, PP (polypropylene) film and the like. Roughly, the printer 1 is equipped with a delivery part 2 (delivery area) for which the sheet S is delivered from the delivery shaft 20, a processing part 3 (processing area) for which an image is recorded on the sheet S delivered from the delivery part 2, and a winding part 4 (winding area) for which the sheet S on which the image is recorded at the processing part 3 is wound onto a winding shaft 40. With the description hereafter, of both surfaces of the sheet S, while the surface on which the image is recorded is called the front surface, the surface on the reverse side of that is called the back surface.

The delivery part 2 has a delivery shaft 20 on which the end of the sheet S is wound, and a following roller 21 on which the sheet S pulled from the delivery shaft 20 is wound. The delivery shaft 20 supports the end of the sheet S by winding it in a state with the front surface of the sheet S facing the outside. Then, by rotating the delivery shaft 20 clockwise in FIG. 1, the sheet S wound on the delivery shaft 20 is delivered to the processing part 3 via the following roller 21. Incidentally, the sheet S is wound on the delivery shaft 20 via a core tube 22 that is detachable with the delivery shaft 20. Therefore, when the sheet S of the delivery shaft 20 is used up, it is possible to mount a new core tube 22 on which the roll form sheet S is wound and replace the sheet S of the delivery shaft S.

The processing part 3 suitably performs processing using each functional unit 51, 52, 61, 62, and 63 arranged along the outer circumference surface of a rotating drum 30 while supporting the sheet S delivered from the delivery part 2 on the rotating drum 30, and records images on the sheet S. With this processing part 3, a forward drive roller 31 and a rear drive roller 32 are provided at both sides of the rotating drum 30, and the sheet S delivered from the forward drive roller 31 to the rear drive roller 32 is supported on the rotating drum 30 and then undergoes image recording.

The forward drive roller 31 has a plurality of tiny projections formed by spraying on the outer circumference surface, and the sheet S delivered from the delivery part 2 is wound from the back surface side. Then, by the forward drive roller 31 rotating clockwise in FIG. 1, the sheet S delivered from the delivery part 2 is conveyed to the downstream side of the conveyance path. A nip roller 31n is provided on the forward drive roller 31. This nip roller 31n abuts the surface of the sheet S in a state energized to the forward drive roller 31 side, and sandwiches the sheet S between it and the forward drive roller 31. By doing this, the friction force between the forward drive roller 31 and the sheet S is ensured, and it is possible to reliably perform conveying of the sheet S by the forward drive roller 31.

The rotating drum 30 is supported to be able to rotate in both directions of the conveyance direction Ds and the reverse direction to that by a support mechanism not shown in the drawings, and is a cylinder shaped drum having a diameter of 400 mm, for example, with the sheet S delivered from the forward drive roller 31 to the rear drive roller 32 wound from the back surface side. This rotating drum 30 supports the sheet S from the back surface side while receiving friction force between it and the sheet S, and doing following rotation in the sheet S conveyance direction Ds. Incidentally, with the processing part 3, following rollers 33 and 34 that turn back the sheet S at both sides of the wound part to the rotating drum 3 are provided. Of these, the following roller 33 turns back the sheet S by winding the front surface of the sheet S between the forward drive roller 31 and the rotating drum 30. Meanwhile, the following roller 34 turns back the sheet S by winding the front surface of the sheet S between the rotating drum 30 and the rear drive roller 32. In this way, by turning back the sheet S respectively at the up and downstream sides of the conveyance direction Ds with respect to the rotating drum 30, it is possible to ensure a long wound part of the sheet S on the rotating drum 30.

The rear drive roller 32 has a plurality of tiny projections formed by spraying on the outer circumference surface, and the sheet S delivered from the rotating drum 30 via the following roller 34 is wound from the back surface. Then, by the rear drive roller 32 rotating clockwise in FIG. 1, the sheet S is conveyed to the winding part 4. A nip roller 32n is provided on the rear drive roller 32. This nip roller 32n abuts the front surface of the sheet S in a state energized to the rear drive roller 32 side, and the sheet S is sandwiched between it and the rear drive roller 32. By doing this, friction force is ensured between the rear drive roller 32 and the sheet S, and it is possible to reliably convey the sheet S using the rear drive roller 32.

In this way, the sheet S conveyed from the forward drive roller 31 to the rear drive roller 23 is supported on the outer circumference surface of the rotating drum 30. Then, with the processing part 3, to record a color image on the front surface of the sheet S supported on the rotating drum 30, a plurality of recording heads 51 corresponding to mutually different colors are provided. In specific terms, four recording heads 51 corresponding to yellow, cyan, magenta, and black are aligned in the conveyance direction Ds in this color sequence. Each recording head 51 faces opposite the front surface of the sheet S wound on the rotating drum 30 with a slight clearance open, and discharges ink of the corresponding color (colored ink) from nozzles using the inkjet method. Then, by each recording head 51 discharging ink on the sheet S conveyed in the conveyance direction Ds, a color image is formed on the front surface of the sheet S.

Incidentally, as the ink, UV (ultraviolet) ink that is cured by the irradiation of ultraviolet rays (light) (photocurable ink) is used. In light of that, with the processing part 3, to cure the ink and fix it to the sheet S, UV irradiators 61 and 62 (irradiation devices) are provided. This ink curing is executed divided into two stages of preliminary curing and main curing. The UV irradiator 61 for preliminary curing is arranged between each of the plurality of recording heads 51. In other words, the UV irradiators 61, by irradiating ultraviolet light of weak irradiation strength, cure the ink to a level for which the ink wetting and spreading is sufficiently slow (preliminary curing) compared to when ultraviolet light is not irradiated, and do not do main curing of the ink. On the other hand, the UV irradiator 62 for doing main curing is provided at the downstream side of the conveyance direction Ds with respect to the plurality of recording heads 51. In other words, the UV irradiator 62 does curing to the level at which the ink wetting and spreading is stopped (main curing) by irradiating ultraviolet light of a stronger irradiation strength than the UV irradiators 61.

In this way, the UV irradiators 61 arranged between each of the plurality of recording heads 51 do preliminary curing of the colored ink discharged on the sheet S from the recording heads 51 on the upstream side of the conveyance direction Ds. Therefore, the ink discharged on the sheet S by one recording head 51 undergoes preliminary curing by the time it reaches the adjacent recording head 51 to the one recording head 51 at the downstream side of the conveyance direction Ds. By doing this, the occurrence of mixed colors by which colored inks of different colors are mixed together is suppressed. In this kind of state with mixed colors suppressed, the plurality of recording heads 51 discharge colored inks having mutually different colors, and form a color image on the sheet S. Also, the UV irradiator 62 for main curing is provided further to the downstream side in the conveyance direction Ds than the plurality of recording heads 51. Because of that, the color image formed using the plurality of recording heads 51 undergoes main curing by the UV irradiator 62 and is fixed on the sheet S.

Furthermore, the recording head 52 is provided at the downstream side of the conveyance direction Ds with respect to the UV irradiator 62. This recording head 52 faces opposite the surface of the sheet S rolled onto the rotating drum 30 with a slight clearance left open, and discharges transparent UV ink onto the surface of the sheet S from nozzles using the inkjet method. In other words, transparent ink is further discharged onto the color image formed using the four colors of recording heads 51. This transparent ink is discharged on the entire surface of the color image, and gives the color image a feeling of glossiness or matte finish. Also, a UV irradiator 63 (irradiation device) is provided to the downstream side of the conveyance direction Ds with respect to the recording head 52. By this UV irradiator 63 irradiating strong ultraviolet light, it does main curing of the transparent ink discharged by the recording head 52. By doing this, it is possible to fix the transparent ink to the sheet S surface.

In this way, with the processing part 3, ink discharge and curing are suitably executed on the sheet S wound onto the outer circumference part of the rotating drum 30, and a color image coated with transparent ink is formed. Then, the sheet S on which this color image is formed is conveyed to the winding part 4 by the rear drive roller 32.

In addition to the winding shaft 40 on which the end of the sheet S is wound, this winding part 4 has a following roller 41 on which the sheet S is wound from the back surface side between the winding shaft 40 and the rear drive roller 32. In a state with the front surface of the sheet S facing the outside, the winding shaft 40 winds up and supports the end of the sheet S. In other words, when the winding shaft 40 rotates clockwise in FIG. 1, the sheet S conveyed from the rear drive roller 32 is wound onto the winding shaft 40 via the following roller 41. Incidentally, the sheet S is wound onto the winding shaft 40 via a core tube 42 that can be attached and detached with the winding shaft 40. Therefore, it is possible to remove the sheet S for each core tube 42 when the sheet S wound onto the winding shaft 40 becomes full.

Figure 2:
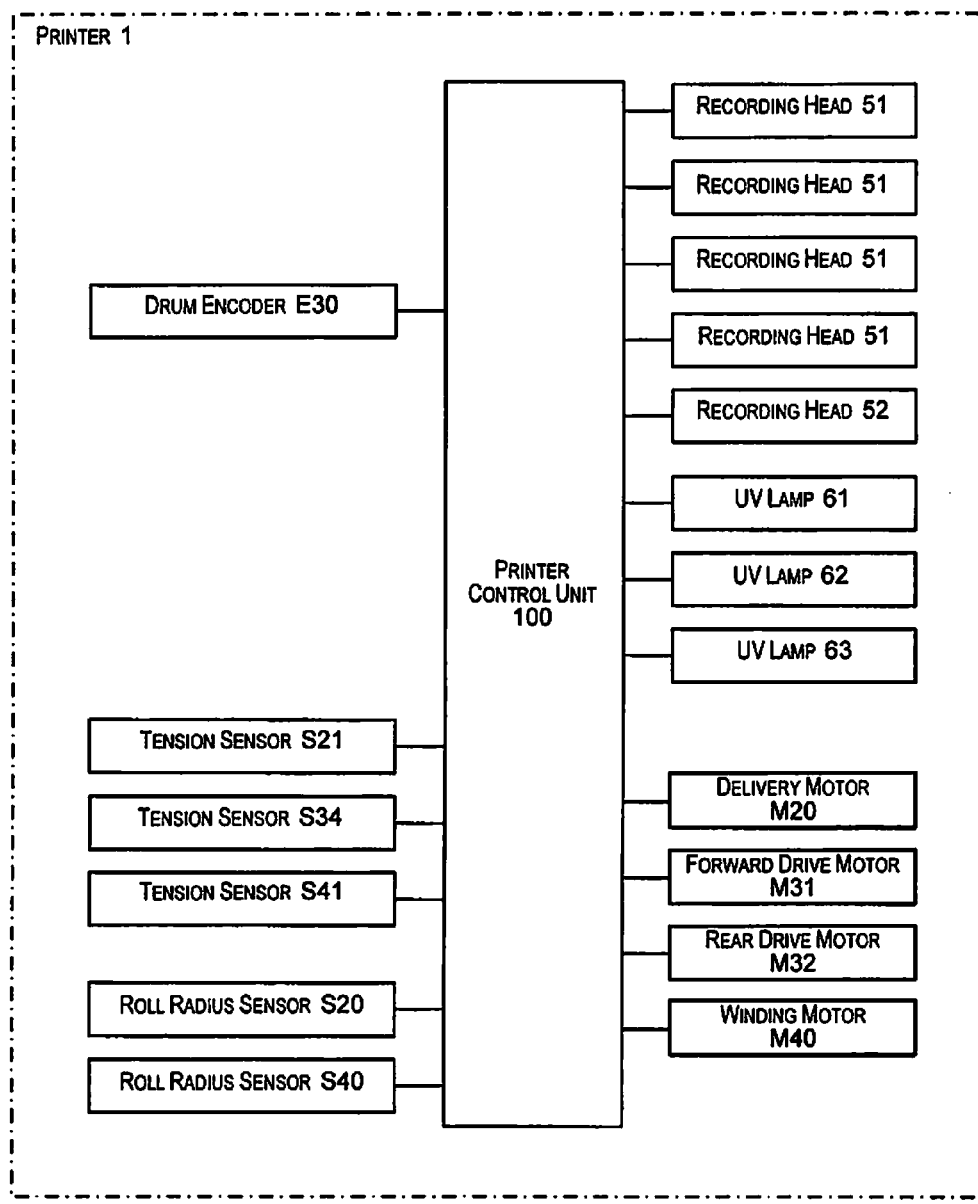
FIG. 2 is a block diagram schematically showing an example of the electrical configuration for controlling the printer shown in FIG. 1.

The above was a summary of the device constitution of the printer 1. Next, the electrical constitution for controlling the printer 1 will be described. FIG. 2 is a block diagram schematically showing an example of an electrical configuration for controlling the printer shown in FIG. 1. A printer control unit 100 that controls each part of the printer 1 is provided with the printer 1. Also, each device part including the recording heads, the UV irradiators, and the sheet conveyance system is controlled by the printer control unit 100. The details of control by the printer control unit 100 on each of these device parts are as noted hereafter.

The printer control unit 100 controls the ink discharge timing of each recording head 51 for forming color images according to the conveyance of the sheet S. More specifically, this ink discharge timing control is executed based on the output (detection value) of a drum encoder E30 that is attached to the rotating shaft of the rotating drum 30 and detects the rotation position of the rotating drum 30. In other words, the rotating drum 30 does driven rotation following the conveyance of the sheet S, so if the output of the drum encoder E30 that detects the rotation position of the rotating drum 30 is referenced, it is possible to grasp the conveyance position of the sheet S. In light of that, the printer control unit 100 generates pts (print timing signal) signals from the output of the drum encoder E30, and by controlling the ink discharge timing of each recording head 51 based on the pts signal, the ink discharged by each recording head 51 is made to impact target positions on the conveyed sheet S, and a color image is formed.

Also, the timing for the recording head 52 to discharge the transparent ink is similarly controlled by the printer control unit 100 based on the output of the drum encoder E30. By doing this, it is possible to suitably discharge transparent ink on the color image formed by the plurality of recording heads 51. Furthermore, the light on and off timing and the irradiated light volume of the UV irradiators 61, 62, and 63 are also controlled by the printer control unit 100.

Also, the printer control unit 100 is in charge of the function of controlling the conveyance of the sheet S described in detail using FIG. 1. In other words, of the members constituting the sheet conveyance system, a motor is connected respectively to the delivery shaft 20, the forward drive roller 31, the rear drive roller 32, and the winding shaft 40. Also, the printer control unit 100 controls the speed and torque of each motor while rotating these motors, and controls the conveyance of sheet S. The details of this sheet S conveyance control are as noted hereafter.

The printer control unit 100 rotates a delivery motor M20 that drives the delivery shaft 20 and supplies the sheet S from the delivery shaft 20 to the forward drive roller 31. At this time, the printer control unit 100 controls the torque of the delivery motor M20, and adjusts the sheet S tension (delivery tension Ta) from the delivery shaft 20 to the forward drive roller 31. In other words, a tension sensor S21 that detects the size of the delivery tension Ta is attached to the following roller 21 arranged between the delivery shaft 20 and the forward drive roller 31. This tension sensor S21 can be constituted by load cells that detect the size of the force received from the sheet S, for example. Also, the printer control unit 100 performs feedback control of the torque of the delivery motor M20 based on the detection results (detection value) of the tension sensor S21 and adjusts the delivery tension Ta of the sheet S.

Also, the printer control unit 100 rotates the forward drive motor M31 that drives the forward drive roller 31 and the rear drive motor M32 that drives the rear drive roller 32. By doing this, the sheet S fed from the delivery part 2 passes through the processing part 3. At this time, while speed control is executed on the forward drive motor M31, torque control is executed on the rear drive motor M32. In other words, the printer control unit 100 adjusts the rotation speed of the forward drive motor M31 to be constant based on the encoder output of the forward drive motor M31. By doing this, the sheet S is conveyed at a constant speed by the forward drive roller 31.

Meanwhile, the printer control unit 100 adjusts the tension of the sheet S (process tension Tb) from the forward drive roller 31 to the rear drive roller 32 by controlling the torque of the rear drive motor M32. In other words, a tension sensor S34 that detects the size of the process tension Tb is attached to the following roller 34 arranged between the rotating drum 30 and the rear drive roller 32. This tension sensor S34 can for example be constituted using load cells that detect the size of the force received from the sheet S. Also, the printer control unit 100 adjusts the process tension Tb of the sheet S by doing feedback control of the torque of the rear drive motor M32 based on the detection results (detection value) of the tension sensor S34.

Also, the printer control unit 100 rotates the winding motor M40 that drives the winding shaft 40, and winds the sheet S conveyed by the rear drive roller 32 onto the winding shaft 40. At this time, the printer control unit 100 controls the torque of the winding motor M40 and adjusts the tension of the sheet S (winding tension Tc) from the rear drive roller 32 to the winding shaft 40. In other words, a tension sensor S41 that detects the size of the winding tension Tc is attached to the following roller 41 arranged between the rear drive roller 32 and the winding shaft 40. This tension sensor S41 can be constituted, for example, by load cells that detect the size of the force received from the sheet S. Also, the printer control unit 100 performs feedback control of the torque of the winding motor M40 based on the detection results (detection value) of the tension sensor S41 and adjusts the winding tension Tc of the sheet S.

Figure 3:
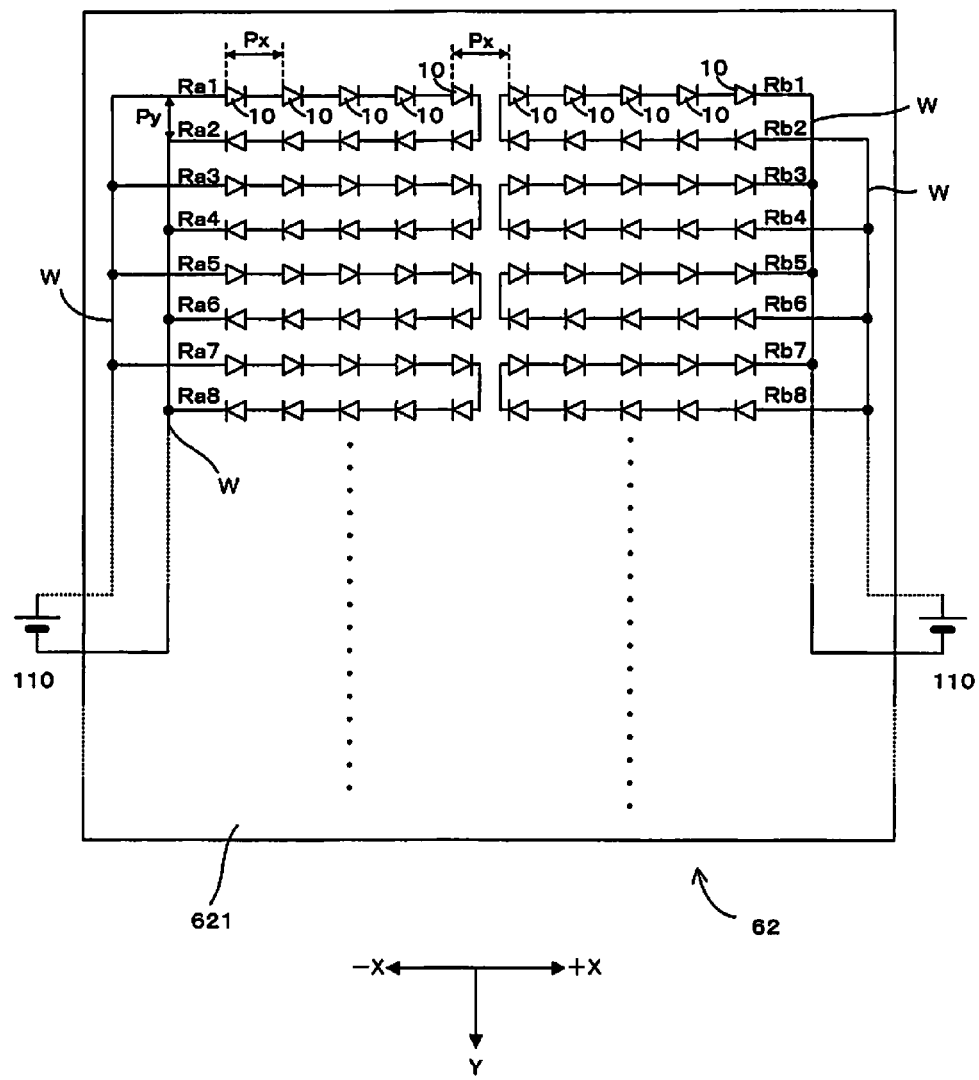
FIG. 3 is a bottom view schematically showing an example of an LED array with a UV irradiator.

Next, the detailed constitution that the UV irradiators 62 and 63 for main curing have will be described. Because the UV irradiators 62 and 63 have similar constitutions, the following description will be made using the UV irradiator 62 as a representative example. FIG. 3 is a bottom view schematically showing an example of the LED array of the UV irradiator. In the drawing, the +X direction and the −X direction are parallel to the conveyance direction Ds, and the +X direction faces the same side as the conveyance direction Ds, while the −X direction faces the opposite side of the conveyance direction Ds. The Y direction is the direction orthogonal to the +X direction and the −X direction, and corresponds to the sheet S width direction. Incidentally, when the directions are not particularly distinguished, the +X direction and the −X direction can simply be called the X direction.

As shown in FIG. 3, the UV irradiator 62 is equipped with an LED support substrate 621 having a front surface parallel to the XY plane. With the front surface of this LED support substrate 621, a plurality of LEDs 10 are arrayed in a matrix form in the X direction and Y direction, and face opposite the sheet S described above. In specific terms, the ten LEDs 10 in the X direction (array direction) are aligned at an equal pitch Px, and the 88 LEDs 10 in the Y direction (direction orthogonal to the array direction) are aligned at an equal pitch Py. Here, the pitch Px and the pitch Py can be equal to each other, or can be different from each other.

In particular with this embodiment, a plurality of rows of LED rows Ra1, Ra2, . . . are aligned in the Y direction at the −X direction side of the LED support substrate 621, and a plurality of rows of LED rows Rb1, Rb2, . . . are aligned at the +X side direction of the LED support substrate 621. In this way, the plurality of rows of LED rows Ra1, Ra2, . . . and the plurality of rows of LED rows Rb1, Rb2, . . . are respectively adjacent in the X direction (in other words, the LED row Ra1 and the LED row Rb1 are adjacent in the X direction). The LED rows Ra1, Ra2, . . . , Rb1, Rb2, . . . respectively have a plurality (five) of LEDs 10 electrically connected in series arranged in a row toward the X direction. These LEDs 10 are UV LEDs that irradiate ultraviolet rays.

Of the LED rows Ra1, Ra2, . . . of the −X direction side, with the odd numbered LED rows Ra1, Ra3, . . . counting in the Y direction, the anode of each LED 10 faces the −X direction, and the cathode of each LED 10 faces the +X direction. Therefore, the direction of the current that flows in the odd numbered LED rows Ra1, Ra3, . . . counting in the Y direction is the +X direction. Also, of the −X side LED rows Ra1, Ra2, . . . , with the even numbered LED rows Ra2, Ra4, . . . counting in the Y direction, the anode of each LED 10 faces the +X direction, and the cathode of each LED 10 faces the −X direction. Therefore, the direction of the current that flows in the even numbered LED rows Ra2, Ra4, . . . counting in the Y direction is the −X direction. In this way, with the LED support substrate 621, the LED rows Ra1, Ra3, . . . for which the current flows in the +X direction and the LED rows Ra2, RA4, . . . for which the current flows in the −X direction are alternately aligned in the Y direction.

Also, the LED rows Ra1 and Ra2 with two rows aligned adjacent in the Y direction are electrically connected in series. In specific terms, the LED 10 at the end of the +X direction (inside) of the LED row Ra1 and the LED 10 at the end of the +X direction (inside) of the LED row Rat are electrically connected. Also, so that the LED rows Ra3 and Ra4 are electrically connected in series at the end of the +X direction, and the LED rows Ra5 and Ra6 are electrically connected in series at the end of the +X direction, the same mode of connection is performed for the other LED rows as well. Also, the LEDs 10 of the −X direction end of the odd numbered LED rows Ra1, Ra3, . . . counting in the Y direction are connected via wiring W (power line) to the positive pole of a current source 110 provided on the printer control unit 100, and the LEDs 10 of the −X direction end of the even numbered LED rows Ra2, Ra4, . . . counting in the Y direction are connected via wiring W to the negative pole of the current source 110. By doing this, current is supplied from the current source 110 to the respective LED rows Ra1, Ra2, . . . , and ultraviolet rays (light) of a light volume according to the respective current of the LED rows Ra1, Ra2, . . . is emitted.

Of the LED rows Rb1, Rb2, . . . of the +X direction side, with the odd numbered LED rows Rb1, Rb3, . . . counting in the Y direction, the anode of each LED 10 faces the −X direction, and the cathode of each LED 10 faces the +X direction. Therefore, the direction of the current that flows in the odd numbered LED rows Rb1, Rb3, . . . counting in the Y direction is the +X direction. Also, of the +X side LED rows Rb1, Rb2, . . . , with the even numbered LED rows Rb2, Rb4, . . . counting in the Y direction, the anode of each LED 10 faces the +X direction, and the cathode of each LED 10 faces the −X direction. Therefore, the direction that the current flows in the even numbered LED rows Rb2, Rb4, . . . counting in the Y direction is the −X direction. In this way, with the LED support substrate 621, the LED rows Rb1, Rb3, . . . for which the current that flows in the +X direction and the LED rows Rb2, Rb4, . . . for which the current flows in the −X direction are aligned alternately one row each in the Y direction.

Also, the LED rows Rb1 and Rb2 aligned two rows adjacent in the Y direction are electrically connected in series. In specific terms, the LEDs 10 of the −X direction (inside) end of the LED row Rb1 and the LED 10 of the −X direction (inside) end of the LED row Rb2 are electrically connected. Also, so that the LED rows Rb3 and Rb4 are electrically connected in series at the −X direction end, and the LED rows Rb5 and Rb6 are electrically connected in series at the −X direction end, the same mode of connecting is performed for the other LED rows as well. Also, the LEDs 10 of the +X direction end of the odd numbered LED rows Rb1 and Rb3 counting in the Y direction are connected via wiring W to the negative pole of the current source 110, and the LEDs 10 of the +X direction of the even numbered LED rows Rb2, Rb4, . . . counting in the Y direction are connected via wiring W to the positive pole of the current source 110. By doing this, current is supplied from the current source 110 respectively to the LED rows Rb1, Rb2, . . . , and ultraviolet rays (light) of a light volume according to the respective current of the LED rows Rb1, Rb2, . . . is emitted. The current source 110 is shown respectively for the −X direction side and the +X direction side, but these can also be constituted with one current source 110.

Figure 4:
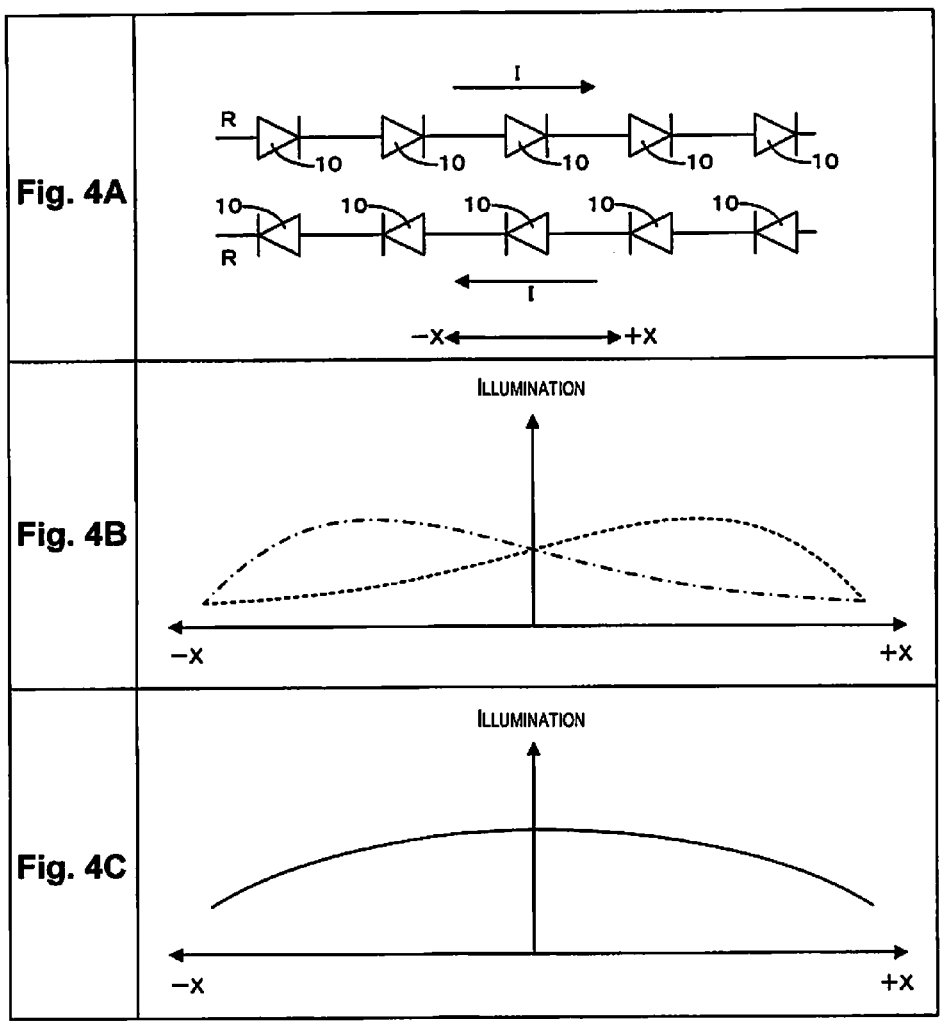
FIGS. 4A-4C are explanatory diagrams for describing the illumination distribution of the UV irradiator.

FIGS. 4A-4C are explanatory drawings for describing the illumination distribution of the UV irradiator, and with FIG. 4A, LED rows R adjacent in the Y direction are shown as an example, with FIG. 4B, the illumination distribution of each LED row R is schematically shown as an example, and with FIG. 4C, the illumination distribution added together by the illumination distribution of each of the LED rows R is schematically shown as an example. With FIGS. 4A-4C, the LED rows are expressed by the code R without distinguishing between Ra1, Ra2, . . . , Rb1, Rb2, . . . .

The illumination distribution that the LED rows R of the top side of this FIG. 4A have is shown by the dotted line in this FIG. 4B, and the illumination distribution that the LED rows R of the lower side of this FIG. 4A have is shown by the dot-dash line in this FIG. 4B. As can be understood from these, the peak of the illumination distribution of the LED rows R has a tendency to bias to the downstream side of the current I direction (this point can be confirmed using for example the LED NS400L-4SFH made by Nitride Semiconductor Corp., or the S35L-U made by SemiLEDs Corp.). In contrast to this, as was explained with FIG. 3 as well, with this embodiment, the directions of the current I flowing respectively in the two LED rows R adjacent in the Y direction are opposite. Therefore, the directions of the bias of the peaks of the illumination distribution of the respective two LED rows R adjacent in the Y direction are also opposite. Because of that, as schematically shown by example in this FIG. 4C, with the overall LED rows R that are adjacent, the peak bias is relatively inhibited. As a result, it is possible to inhibit the bias of the illumination distribution of the UV irradiator 62.

Also, with the printer 1, ink is cured by the UV irradiators 62 and 63 for which bias of the illumination distribution is inhibited in this way. Because of that, ink is suitably cured, and it is possible to form a good image.

Also, as described above, the LED rows Ra1 and Ra2 are connected in series at the end of the +X direction (one of the array directions), and it is possible to supply current from the −X direction to the LED rows Ra1 and Ra2. Also, at the −X direction side of the LED support substrate 621, the same constitution is also provided for the other LED rows Ra3, Ra4, . . . , and it is possible to supply current from the −X direction (other of the array directions) end. In this way, it is possible to supply current from the same side (−X direction side) to each LED row Ra1, Ra2, . . . provided at the −X direction side of the LED support substrate 621, so leading of the wiring W for supplying current is easy.

Similarly, the LED rows Rb1 and Rb2 are connected in series at the −X direction (other of the array directions) end, so it is possible to supply current from the +X direction (one of the array directions) end to the LED rows Rb1 and Rb2. Also, at the +X direction side of the LED support substrate 621, the same constitution is also provided for the other LED rows Rb3, Rb4, . . . , and it is possible to supply current from the +X direction (one array direction) end. In this way, it is possible to supply current from the same side (+X direction side) to each LED row Rb1, Rb2, . . . provided at the +X direction side of the LED support substrate 621, so leading of the wiring W for supplying current is easy.

As shown in FIG. 3, the −X direction side LED rows Ra1, Ra2, . . . and the +X direction side LED rows Rb1, Rb2, . . . are respectively adjacent in the X direction. Specifically, with this embodiment, the LEDs 10 contained in the LED row Ra1 on the −X direction side and the LEDs 10 contained in the LED row Rb1 on the +X direction side are positioned on the same straight line extending in the X direction. Similarly, the LEDs 10 contained in the LED row Ra2 on the −X direction side, and the LEDs 10 contained in the LED row Rb2 of the +X direction side are positioned on the same straight line extending in the X direction. In this case, the wiring W for supplying current to the LED rows Ra1, Ra2, . . . and the wiring W for supplying current to the LED rows Rb1, Rb2, . . . are suitably lead without interfering with each other. In contrast to this, it is possible to supply current at one end of the −X direction end to the LED rows Ra1, Ra2, . . . , and to supply current at the +X direction end to the LED rows Rb1, Rb2, . . . . As a result, the leading of the wiring W for the LED rows Ra1, Ra2, . . . and the leading of the wiring W for the LED rows Rb1, Rb2, . . . can be performed on mutually opposite sides (the −X direction side and the +X direction side) without interference.

However, the printer 1 cures ink discharged on the sheet S by irradiating ultraviolet rays on the sheet S conveyed in the conveyance direction Ds. With this printer 1, when the bias of the illumination distribution of the ultraviolet rays of the conveyance direction Ds is large, there is the risk of not being able to do ink curing suitably. In contrast to this, with the UV irradiators 62 and 63, a plurality of LEDs 10 are aligned in the conveyance direction Ds for the respective LED rows Ra1, Ra2, . . . , Rb1, Rb2, . . . . In other words, as shown in FIGS. 4A-4C and the like, the UV irradiators 62 and 63 are equipped with constitutions for inhibiting bias of the illumination distribution in the array direction (X direction) of the LEDs 10. In light of that, by matching the conveyance direction Ds and the array direction of the LEDs 10 (said another way, the conveyance direction Ds and the direction in which current flows in the LED rows), it is possible to inhibit bias of the illumination distribution in the conveyance direction Ds, and possible to suitably perform ink curing.

In this way, with this embodiment, of the −X direction side LED rows Ra1, Ra2, . . . , the respective odd numbered LED rows Ra1, Ra3, . . . counting in the Y direction correlate to an example of the "first LED rows" of the present invention, and the respective even numbered LED rows Ra2, Ra4, . . . counting in the Y direction correlate to an example of the "second LED rows" of the present invention. Also, of the +X direction side LED rows Rb1, Rb2, . . . , the respective odd numbered LED rows Rb1, Rb3, . . . counting in the Y direction correlate to an example of the "third LED rows" of the present invention, and the respective even numbered LED rows Rb2, Rb4, . . . counting in the Y direction correlate to an example of the "fourth LED rows" of the present invention.

Also, the printer 1 correlates to an example of the "image recording device" of the present invention, the UV irradiators 62 and 63 correlate to an example of the "irradiation device" of the present invention, the delivery shaft 20, the forward drive roller 31, the rear drive roller 32, and the winding shaft 40 work jointly to function as an example of the "conveyance unit" of the present unit, and the recording head 51 correlates to an example of the "discharge unit" of the present invention.

The present invention is not limited to the embodiment noted above, and it is possible to add various modifications to the items described above in a range that does not stray from the gist. In light of that, for example it is possible to constitute this as with the first to third modification examples shown hereafter. Following, the difference points from the embodiment noted above will be mainly described, and the description as appropriate for common points will be omitted. It also goes without saying that the same effects can be exhibited by being equipped with constitutions in common with the embodiment noted above.

Figure 5:
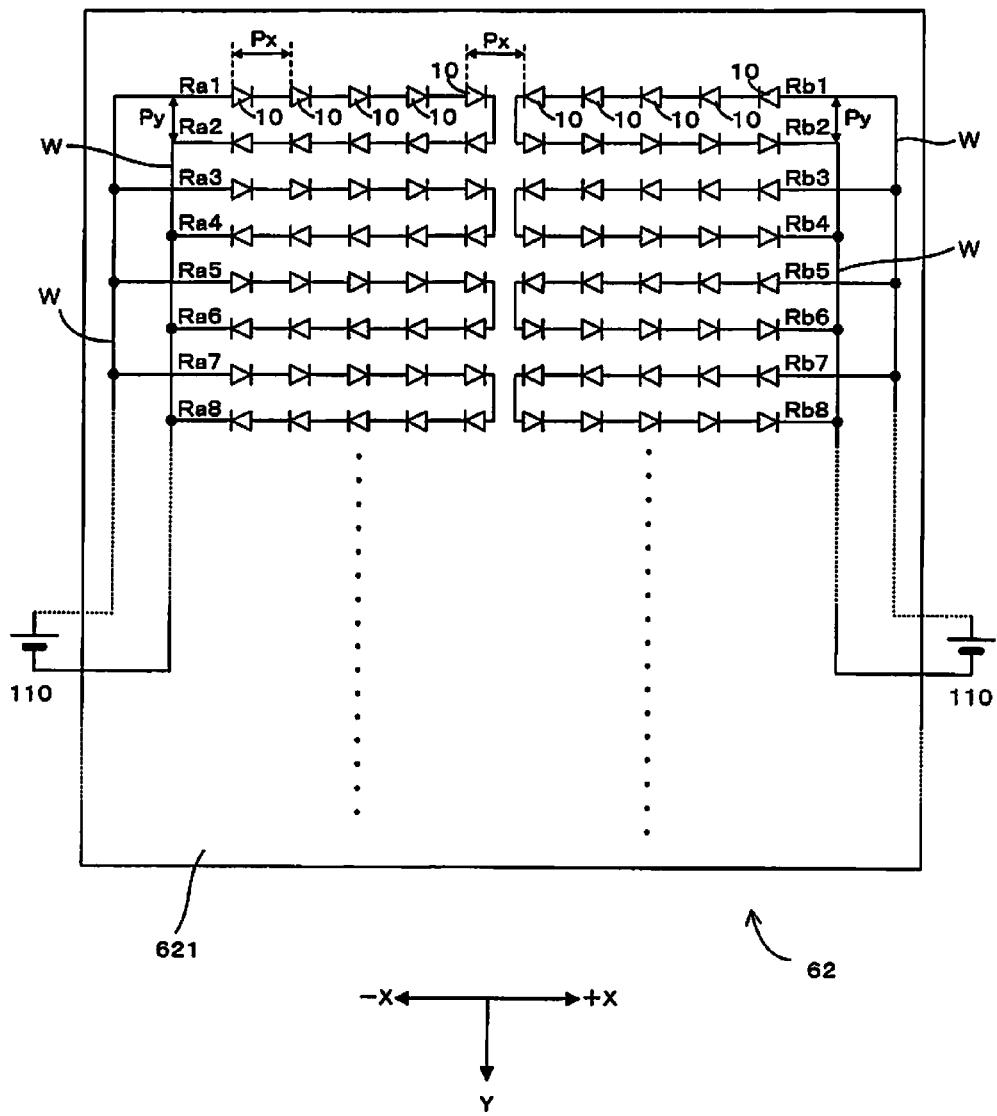
FIG. 5 is a bottom view schematically showing an example of an array of LEDs on the UV irradiator of a first modification example.

FIG. 5 is a bottom view schematically showing an example of the LED array with the UV irradiator of the first modification example. The main difference point between the embodiment noted above and the first modification example of FIG. 5 is the point that the LED 10 orientation with respect to the respective LED rows Rb1, Rb2, . . . of the +X direction side are opposite. In other words, with the odd numbered LED rows Rb1, Rb3, . . . counting in the Y direction, the anode of each LED 10 faces the +X direction, and the cathode of each LED 10 faces the −X direction. Therefore, the direction of the current that flows in the even numbered LED rows Rb1, Rb3, . . . counting in the Y direction is the −X direction. Also, with the even numbered LED rows Rb2, Rb4, . . . counting in the Y direction, the anode of each LED 10 faces the −X direction, and the cathode of each LED 10 faces the +X direction. Therefore, the direction of the current flowing in the even numbered LED rows Rb2, Rb4, . . . counting in the Y direction is the +X direction.

As a result, the plurality of rows of the LED rows Ra1, Ra2, . . . and the plurality of rows of the LED rows Rb1, Rb2, . . . adjacent in the X direction are respectively opposite for the current direction. Incidentally, with the embodiment noted above, the plurality of rows of the LED rows Ra1, Ra2, . . . and the plurality of rows of the LED rows Rb1, Rb2, . . . adjacent in the X direction are respectively the same for the current direction.

With this kind of first modification example as well, with the LED support substrate 621, the LED rows Rb1, Rb3, . . . for which current flows in the +X direction and the LED rows Rb2, Rb4, . . . for which the current flows in the −X direction are alternately aligned one row each in the Y direction. Therefore, as was described with FIGS. 4A-4C, the bias directions of the peak of the illumination distribution of the respective two LED rows adjacent in the V direction are opposite. Because of that, as shown schematically as an example in that FIG. 4C, the bias of the peak for the overall adjacent LED rows is relatively inhibited, and it is possible to inhibit the bias of the illumination distribution of the UV irradiator 62.

Figure 6:
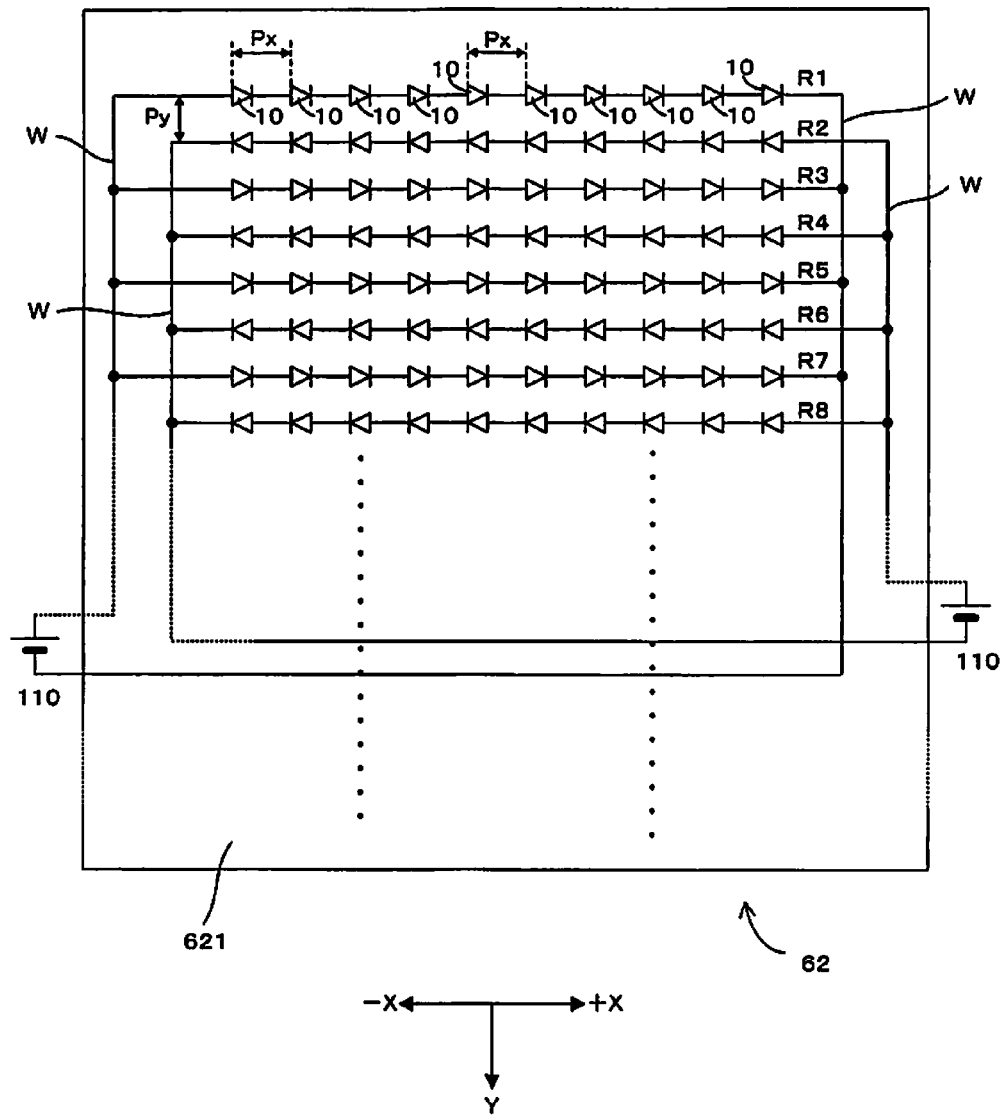
FIG. 6 is a bottom view schematically showing an example of an array of LEDs with the UV irradiator of a second modification example.

FIG. 6 is a bottom view schematically showing an example of the LED array of the UV irradiator of the second modification example. The main difference point between the embodiment noted above and the second modification example is the point that the LED rows are not divided between the −X direction side and the +X direction side, and furthermore, that the LED rows adjacent in the Y direction are not electrically connected in series. In other words, with the LED support substrate 621, the plurality of rows of LED rows R1, R2, . . . provided along the overall X direction are aligned respectively in the Y direction. Then, the respective LED rows R1, R2, . . . have a plurality of (ten) LEDs 10 aligned in one row electrically connected in series in the X direction.

Of the LED rows R1, R2, . . . , with the odd numbered LED rows R1, R3, . . . counting in the Y direction, the anode of each LED 10 faces the −X direction, and the cathode of each LED 10 faces the +X direction. Then, the LEDs 10 of the −X direction end of the LED rows R1, R3, . . . are connected via the wiring W to the positive pole of the current source 110, and the LEDs 10 of the +X direction end of the LED rows R1, R3, . . . are connected via the wiring W to the negative pole of the current source 110. Therefore, the direction of the current flowing in the odd numbered LED rows R1, R3, . . . counting in the Y direction is the +X direction. Also, with the even numbered LED rows R2, R4, . . . counting in the Y direction, the anode of each LED 10 faces the +X direction, and the cathode of each LED 10 faces the −X direction. Therefore, the direction of the current flowing in the even numbered LED rows R2, R4, . . . counting in the Y direction is the −X direction. Then, the LEDs 10 of the +X direction end of the LED rows R2, R4, . . . are connected via the wiring W to the positive pole of the current source 110, and the LEDs 10 of the −X direction end of the LED rows R2, R4, . . . are connected via the wiring W to the negative pole of the current source 110.

With this kind of second modification example, with the LED support substrate 621, the LED rows R1, R3, . . . for which the current flows in the +X direction and the LED rows R2, R4, . . . for which the current flows in the −X direction are alternately aligned one row at a time in the Y direction. Therefore, as described with FIGS. 4A-4C, the directions of the bias of the peak of the illumination distribution of the respective two LED rows adjacent in the Y direction are opposite. Because of that, as schematically shown by example in that FIG. 4C, overall for these LED rows that are adjacent, bias of the peak is relatively inhibited, and it is possible to inhibit the bias of the illumination distribution of the UV irradiator 62.

Figure 7:
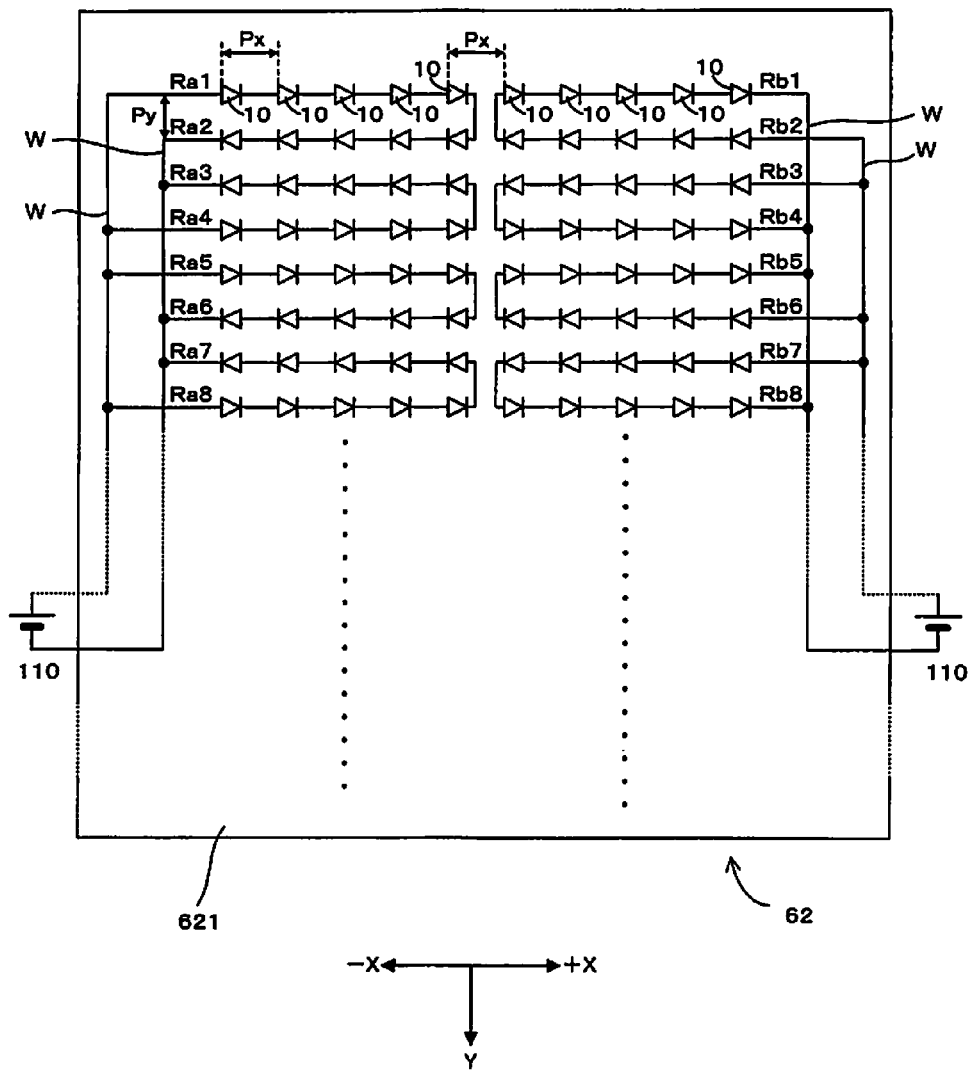
FIG. 7 is a bottom view schematically showing an example of an array of LEDs with the UV irradiator of a third modification example.

FIG. 7 is a bottom view schematically showing an example of the LED array of the UV irradiator of the third modification example. With the embodiment noted above, the LED rows for which the current flows in the +X direction and the LED rows for which the current flows in the −X direction are aligned alternately one row at a time. In contrast to this, the third modification example of FIG. 7 has at least partially an area for which these LED rows are alternately aligned two rows at a time.

In other words, of the LED rows Ra1, Ra2, . . . of the −X direction side, with the LED rows Ra1, Ra4, Ra5, Ra8, . . . , the anode of each LED 10 faces the −X direction, and the cathode of each LED 10 faces the +X direction. Therefore, the direction of the current flowing in the LED rows Ra1, Ra4, Ra5, Ra8, . . . is the +X direction. Meanwhile, of the −X side LED rows Ra1, Ra2, . . . , with the LED rows Ra2, Ra3, Ra6, Ra7, . . . , the anode of each LED 10 faces the +X direction, and the cathode of each LED 10 faces the −X direction. Therefore, the direction of the current flowing in the LED rows Ra2, Ra3, Ra6, Ra7, . . . is the −X direction.

Also, of the +X direction side LED rows Rb1, Rb2, . . . , with the LED rows Rb1, Rb4, Rb5, Rb8, . . . , the anode of each LED 10 faces the −X direction, and the cathode of each LED 10 faces the +X direction. Therefore, the direction of the current flowing in the LED rows Rb1, Rb4, Rb5, Rb8, . . . is the +X direction. Meanwhile, of the +X side LED rows Rb1, Rb2, . . . , the LED rows Rb2, Rb3, Rb6, Rb7, . . . , the anode of each LED 10 faces the +X direction, and the cathode of each LED 10 faces the −X direction. Therefore, the direction of the current flowing in the LED rows Rb2, Rb3, Rb6, Rb7, . . . is the −X direction.

With this kind of third modification example, with the LED support substrate 621, the LED row Ra1 for which current flows in the +X direction, and the LED row Ra2 for which current flows in the −X direction are adjacent. Therefore, the directions of the bias of the peak of the illumination distribution of the respective two LED rows Ra1 and Ra2 are opposite, and it is possible to relatively inhibit the peak bias overall for these. The same is also true for the other LED rows Ra3, Ra4, . . . , Rb1, Rb2, . . . . As a result, it is possible to inhibit the bias of the illumination distribution of the UV irradiator 62.

Other modifications besides the modification shown with this kind of first to third modification examples are also suitably possible. In light of that, it is possible to change the number of LEDs 10 constituting the LED rows. At this time, it is preferable to constitute the LED rows with five or more and ten or less LEDs 10. However, it is also possible to constitute the LED rows with less than five or more than ten LEDs 10. Also, with the description above, each LED row had the same number of LEDs 10. However, it is also possible for the number of LEDs 10 that one portion of the LED rows have to be different from the number of LEDs 10 that other LED rows have. Furthermore, it is also possible to suitably change the number of LED rows aligned in the Y direction.

Also, with the printer 1, a plurality of types of UV irradiators 61, 62, and 63 are provided. At this time, all of these can have the constitution shown in FIG. 3 to FIG. 7 applied, or only a portion of these can have the constitution shown in FIG. 3 to FIG. 7 applied.

Also, for the members that support the conveyed sheet S, this is not limited to being a cylinder shaped item such as the rotating drum 30 noted above. Therefore, it is possible to use a flat platen to support the sheet S with a flat surface.

General Interpretation of Terms

In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Also, the terms "part," "section," "portion," "member" or "element" when used in the singular can have the dual meaning of a single part or a plurality of parts. Finally, terms of degree such as "substantially", "about" and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents.

What is claimed is:

1. An irradiation device comprising:
   a support substrate having a first end and a second end opposite to the first end;
   a first LED row disposed over the support substrate and having a plurality of LEDs aligned in one row and electrically connected in series;
   a second LED row disposed over the support substrate and having a plurality of LEDs aligned in one row and electrically connected in series;
   a third LED row disposed over the support substrate and having a plurality of LEDs aligned in one row and electrically connected in series;
   a fourth LED row disposed over the support substrate and having a plurality of LEDs aligned in one row and electrically connected in series;
   a first power line connected to one of the LEDs in the first LED row, which is disposed closest to the second end of the support substrate;
   a second power line connected to one of the LEDs in the second LED row, which is disposed closest to the second end of the support substrate;
   a third power line connected to one of the LEDs in the third LED row, which is disposed closest to the first end of the support substrate; and
   a fourth power line connected to one of the LEDs in the fourth LED row, which is disposed closest to the first end of the support substrate wherein
   the first LED row and the second LED row are aligned adjacent to each other in a direction that crosses an array direction of the LEDs of the first LED row,
   the third LED row and the fourth LED row are aligned adjacent to each other in the direction that crosses the array direction,
   a direction of current flowing in the first LED row is opposite to a direction of current flowing in the second LED row,
   a direction of current flowing in the third LED row is opposite to a direction of current flowing in the fourth LED row,
   one of the LEDs in the first LED row, which is disposed closest to the first end of the support substrate among the LEDs in the first LED row, and one of the LEDs in the second LED row, which is disposed closest to the first end of the support substrate among the LEDs in the second LED row, are electrically connected so that the first LED row and the second LED row are electrically connected in series,
   the third LED row is arranged between the first end of the support substrate and the first LED row,
   the fourth LED row is arranged between the first end of the support substrate and the second LED row,
   one of the LEDs in the third LED row, which is disposed closest to the second end of the support substrate among the LEDs in the third LED row, and one of the LEDs in the fourth LED row, which is disposed closest to the second end of the support substrate among the LEDs in the fourth LED row, are electrically connected so that the third LED row and the fourth LED row are electrically connected in series,
   the first power line and the second power line are arranged between the second end of the support substrate and the first and second LED rows, and
   the third power line and the fourth power line are arranged between the first end of the support substrate and the third and fourth LED rows.

2. The irradiation device according to claim 1, wherein the direction of the current flowing in the first LED row and the direction of the current flowing in the third LED row are opposite, and
   the direction of the current flowing in the second LED row and the direction of the current flowing in the fourth LED row are opposite.

3. The irradiation device according to claim 1, wherein the direction of the current flowing in the first LED row and the direction of the current flowing in the third LED row are the same, and
   the direction of the current flowing in the second LED row and the direction of the current flowing in the fourth LED row are the same.

4. The irradiation device according to claim 1, wherein a number of the LEDs in the first LED row is in a range of five to ten, and a number of the LEDs in the second LED row is in a range of five to ten.

5. The irradiation device according to claim 1, wherein a number of the LEDs in the first LED row and a number of the LEDs in the second LED row are the same.

6. The irradiation device according to claim 1, wherein the LEDs in the first, second, third and fourth LED rows are configured and arranged to irradiate ultraviolet rays.

7. An image recording device comprising:
   a conveyance unit configured and arranged to convey recording media;
   a discharge unit configured and arranged to discharge photocurable liquid on the recording media conveyed by the conveyance unit; and an irradiation device configured and arranged to cure the liquid discharged on the recording media by irradiating light on the recording media conveyed by the conveyance unit, wherein
the irradiation device includes
- a support substrate having a first end and a second end opposite to the first end,
- a first LED row disposed over the support substrate and having a plurality of LEDs aligned in one row and electrically connected in series, and
- a second LED row disposed over the support substrate and having a plurality of LEDs aligned in one row and electrically connected in series,
- a third LED row disposed over the support substrate and having a plurality of LEDs aligned in one row and electrically connected in series;
- a fourth LED row disposed over the support substrate and having a plurality of LEDs aligned in one row and electrically connected in series;
- a first power line connected to one of the LEDs in the first LED row, which is disposed closest to the second end of the support substrate;
- a second power line connected to one of the LEDs in the second LED row, which is disposed closest to the second end of the support substrate;
- a third power line connected to one of the LEDs in the third LED row, which is disposed closest to the first end of the support substrate; and
- a fourth power line connected to one of the LEDs in the fourth LED row, which is disposed closest to the first end of the support substrate wherein
- the first LED row and the second LED row are aligned adjacent to each other in a direction that crosses an array direction of the LEDs of the first LED row,
- the third LED row and the fourth LED row are aligned adjacent to each other in the direction that crosses the array direction,
- a direction of current flowing in the first LED row is opposite to a direction of current flowing in the second LED row,
- a direction of current flowing in the third LED row is opposite to a direction of current flowing in the fourth LED row,
- one of the LEDs in the first LED row, which is disposed closest to the first end of the support substrate among the LEDs in the first LED row, and one of the LEDs in the second LED row, which is disposed closest to the first end of the support substrate among the LEDs in the second LED row, are electrically connected so that the first LED row and the second LED row are electrically connected in series,
- the third LED row is arranged between the first end of the support substrate and the first LED row,
- the fourth LED row is arranged between the first end of the support substrate and the second LED row,
- one of the LEDs in the third LED row, which is disposed closest to the second end of the support substrate among the LEDs in the third LED row, and one of the LEDs in the fourth LED row, which is disposed closest to the second end of the support substrate among the LEDs in the fourth LED row, are electrically connected so that the third LED row and the fourth LED row are electrically connected in series,
- the first power line and the second power line are arranged between the second end of the support substrate and the first and second LED rows, and
- the third power line and the fourth power line are arranged between the first end of the support substrate and the third and fourth LED rows.

8. The image recording device according to claim 7, wherein
- the LEDs in the first LED row are aligned in a direction in which the conveyance unit conveys the recording media, and
- the LEDs in the second LED row are aligned in the direction in which the conveyance unit conveys the recording media.

* * * * *